US006033489A

United States Patent [19]

Marchant et al.

[11] Patent Number: 6,033,489

[45] Date of Patent: Mar. 7, 2000

[54] SEMICONDUCTOR SUBSTRATE AND METHOD OF MAKING SAME

[75] Inventors: Bruce Douglas Marchant, Salt Lake, Utah; Steven Sapp, Santa Cruz; Thomas Welch, San Jose, both of Calif.

[73] Assignee: Fairchild Semiconductor Corp., South Portland, Me.

[21] Appl. No.: 09/086,654

[22] Filed: May 29, 1998

[51] Int. Cl.[7] .......... H01L 21/302

[52] U.S. Cl. .......... 148/33.2; 148/33.2; 148/33.4; 428/620

[58] Field of Search .......... 148/33.2, 33.4; 117/22; 136/238; 252/62.3; 428/620

[56] References Cited

U.S. PATENT DOCUMENTS

| | | | |
|---|---|---|---|
| 3,428,499 | 2/1969 | Cullis | 148/174 |
| 4,169,008 | 9/1979 | Kurth | 156/600 |
| 4,266,334 | 5/1981 | Edwards | 29/583 |
| 4,470,875 | 9/1984 | Poteat | 156/644 |
| 4,525,924 | 7/1985 | Schafer | 29/580 |
| 4,539,050 | 9/1985 | Kramler et al. | 148/1.5 |
| 4,559,086 | 12/1985 | Hawkins | 148/1.5 |
| 4,597,166 | 7/1986 | Iwai | 29/580 |
| 4,604,161 | 8/1986 | Araghi | 156/645 |
| 4,822,755 | 4/1989 | Hawkins et al. | 437/227 |
| 4,863,560 | 9/1989 | Hawkins | 156/644 |
| 5,034,068 | 7/1991 | Glenn et al. | 136/256 |
| 5,164,804 | 11/1992 | Terashima | 257/487 |
| 5,166,097 | 11/1992 | Tanielian | 437/203 |
| 5,264,378 | 11/1993 | Sakurai | 437/31 |
| 5,523,174 | 6/1996 | Tamaki | 428/669 |
| 5,635,762 | 6/1997 | Gamand | 257/728 |
| 5,800,631 | 9/1998 | Yamada et al. | 136/251 |
| 5,804,847 | 9/1998 | Robinson | 257/257 |
| 5,840,593 | 11/1998 | Leedy | 438/6 |
| 5,913,713 | 6/1999 | Cheek et al. | 451/41 |
| 5,962,081 | 10/1999 | Ohman et al. | 427/534 |

OTHER PUBLICATIONS

Kenneth Bean, "Anisotropic Etching of Silicon", *IEEE Transactions on Electron Devices*, Oct. 19, 1978, pp. 1185–1193.

S. Wolf and R.N. Tauber, *Silicon Processing for the VLSI Era, vol. 1—Process Technology*, Lattice Press, Sunset Beach, CA, 1986, pp. 531–532.

*Primary Examiner*—Joni Chang
*Assistant Examiner*—Granvill D. Lee
*Attorney, Agent, or Firm*—Pierce Atwood; Chris A. Caseiro; Celia H. Leber

[57] ABSTRACT

A semiconductor substrate is provided that exhibits very low substrate resistance while also providing structural integrity and robustness to resist breakage during manufacturing. The invention also provides methods of making these semiconductor substrates. The semiconductor substrate includes a planar surface and a recess extending below the planar surface. Preferred substrates include a plurality of recesses arranged in an array.

8 Claims, 2 Drawing Sheets

10

16

18

14

20

12

20

SEMICONDUCTOR SUBSTRATE AND METHOD OF MAKING SAME

BACKGROUND OF THE INVENTION

The present invention relates to semiconductor substrates and methods of making such substrates.

Power MOSFETS are used as switches and, when turned on, require minimum on-resistance ($RDS_{on}$) for optimum performance. As performance requirements increase, so does the need to minimize $RDS_{on}$.

One component of $RDS_{on}$ is the resistance of the semiconductor substrate (typically a silicon wafer), that the MOSFET is built on.

Attempts have been made to reduce substrate resistance by, e.g., grinding the wafer to reduce its thickness as much as possible. While reducing the thickness of the wafer does reduce substrate resistance, the minimum thickness that is obtainable by grinding and other conventional thinning methods is limited by breakage of the wafer and other manufacturing problems.

SUMMARY OF THE INVENTION

The present invention provides a semiconductor substrate that exhibits very low substrate resistance while also providing structural integrity and robustness to resist breakage during manufacturing. The invention also provides methods of making these semiconductor substrates.

In one aspect, the invention features a semiconductor substrate on one side of which a plurality of active devices will be formed. The semiconductor substrate includes a first planar surface on which the active devices will be formed, a second planar surface on the opposite side of the substrate from the first planar surface, and a recess extending into the substrate from the second planar surface.

Preferred embodiments include one or more of the following features. The substrate includes a plurality of recesses. The recesses are arranged in an array. The recesses are arranged in linear rows and columns. The recesses are substantially pyramidal or truncated pyramidal in shape. The recesses extend through about 20 to 85% of the thickness of the substrate. The angle of the recess wall with respect to the planar substrate surface is from about 40 to 90 degrees. The recesses are coated with a layer of highly conductive material, e.g., gold.

In another aspect, the invention features a method of manufacturing a semiconductor substrate. The method includes providing a wafer of semiconductor material having a planar surface, and forming an array of recesses in the planar surface.

Preferred embodiments include one or more of the following features. The forming step includes patterning the substrate and then etching the substrate. The patterning step is performed using photolithography or printing. The etching step is performed with an orientation-dependent chemical anisotropic silicon etchant. Preferably, after etching a highly conductive layer is applied to the surfaces of the recesses.

Other features and advantages of the invention will be apparent from the following detailed description, the drawings, and the claims.

DETAILED DESCRIPTION OF PREFERRED EMBODIMENTS

Figure 1:
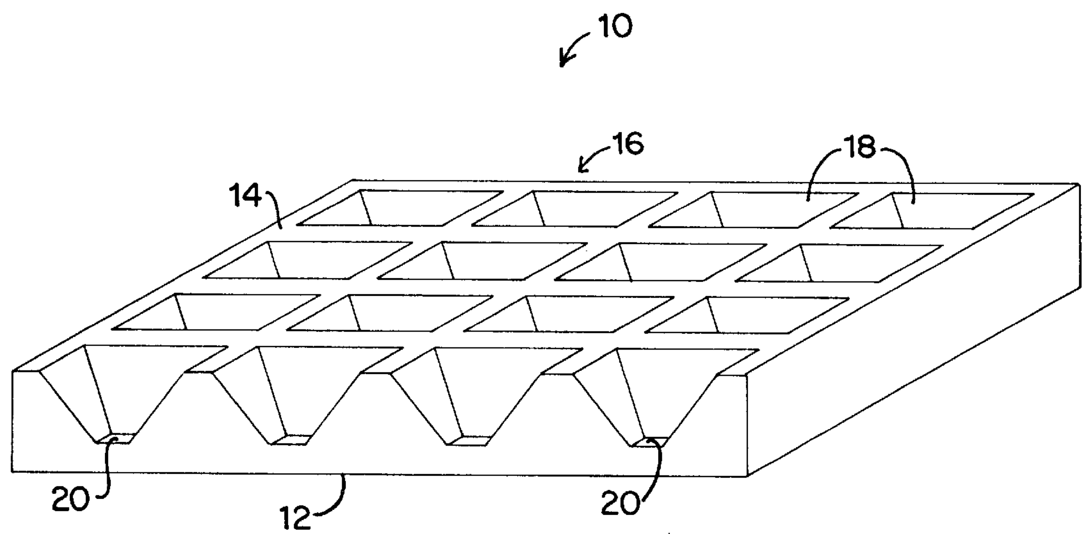
FIG. 1 is a perspective view of a semiconductor substrate according to one embodiment of the invention.

Referring to FIG. 1, semiconductor substrate 10 includes a planar front surface 12 on which a plurality of active devices will be formed (forming semiconductor dies), a planar back surface 14, and an array 16 of recesses 18 extending into the substrate from the back surface 14. The array 16 is comprised of substantially straight rows and columns, so that the backside of the substrate has a substantially uniform distribution of recesses. The recesses are preferably dimensioned so that there will be several recesses on the backside of each die. For certain die sizes, it is preferred that the recess array be aligned with respect to the die pattern on the front surface 12. This arrangement allows the substrate 10 to be sliced into dies that would be consistent for subsequent processing.

The recesses 18 do not extend all the way through the substrate 10. Instead, a predetermined thickness of substrate 10 remains beneath the floor 20 of recesses 18. Preferably, this predetermined thickness is from about 25 to 100 microns. Thus, the minimum thickness of the substrate 10 is this predetermined thickness at the floors of the recesses, and the thickness of the substrate is greater in all other areas of the substrate. This structure provides a structurally robust substrate that can easily withstand the forces that are typically encountered during processing.

Figure 2:
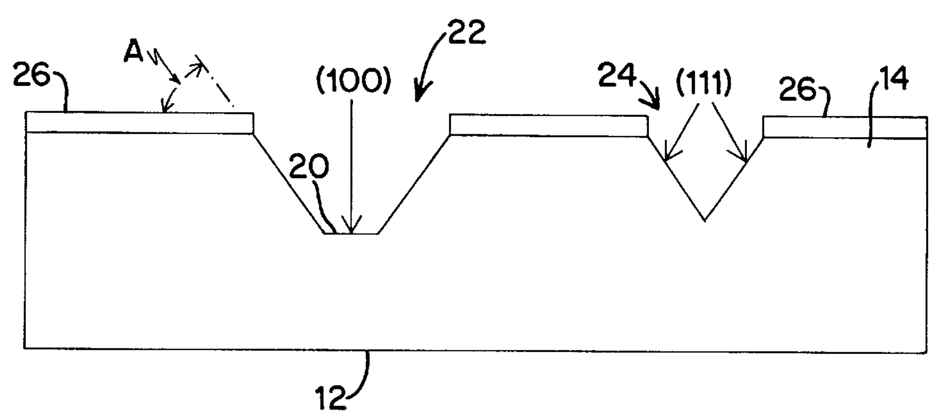
FIG. 2 is a side cross-sectional view showing two different types of recesses that can be used to form a semiconductor substrate.

As shown in FIG. 2, the recesses can have various geometries, for example truncated pyramidal recess 22 and pyramidal recess 24. The manner in which these various shapes can be formed will be described in further detail below. Preferably, the angle A between the planar back surface 14 and the wall 16 of the recess is from about 40 to 90 degrees, more preferably about 55 degrees, as shown.

Figure 3:
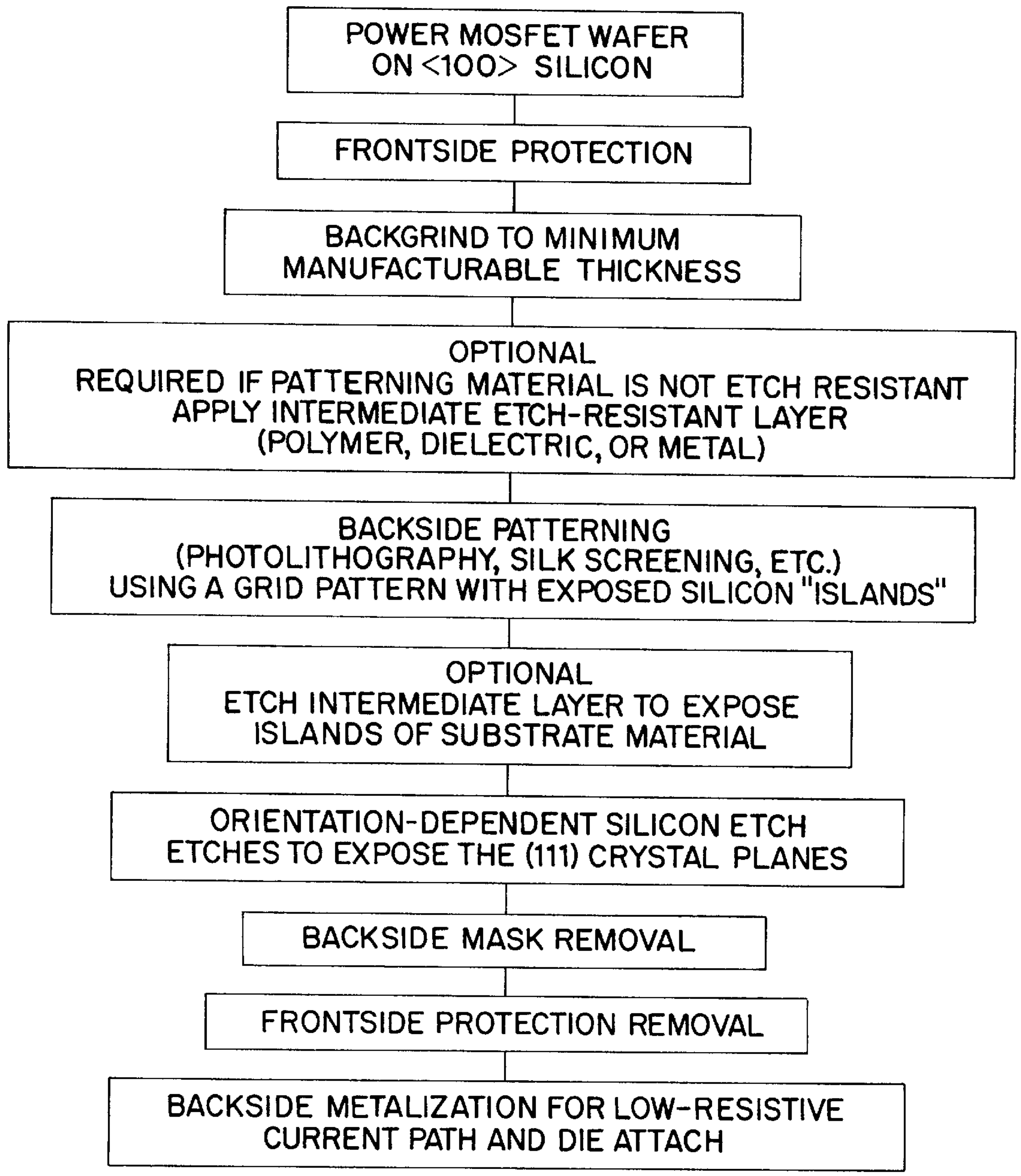
FIG. 3 is a flow diagram illustrating a process flow suitable for use in manufacturing a semiconductor substrate according to one embodiment of the invention.

A preferred process flow for manufacturing the substrate 10 is shown in FIG. 3. Thus, the planar front surface 12 of the substrate 10 is protected, e.g., by tape, a photoresist or any other suitable protection. Next the back surface of the substrate is ground to a predetermined thickness, preferably the minimum manufacturable thickness (i.e., the minimum thickness at which the substrate, without the recesses, can be handled without breakage), to form the planar back surface 14. The minimum manufacturable thickness is generally about 175 to 250 microns. Depending on the reactivity of the patterning material with the etchant, an intermediate material that is resistant to the etchant may need to be applied to back surface 14. Suitable intermediate materials include silicon dioxide and nitride. Next, the planar back surface 14 is patterned using conventional methods, e.g., photolithography, to mask a grid pattern and leave exposed "islands" where the recesses are to be formed (see mask layer 26 in FIG. 2). If an intermediate material was applied beneath the patterning material, it is now removed from the "islands" using a suitable etchant. Next, the back surface 14 is etched to remove substrate material from the "island" areas that are not covered by the mask layer and thereby form the recesses 18. After the recesses have been formed, the mask is removed, the front planar surface protection is removed, and a highly conductive material is deposited on the planar back surface.

The different geometries shown in FIG. 2 can be formed by masking the planar back surface 14 and etching with an orientation-dependent chemical anisotropic silicon etchant, for example a mixture of KOH, normal propanol and water. Methods of anisotropic etching of silicon are well known, and are described, e.g., in "Anisotropic Etching of Silicon", Kenneth E. Bean, IEEE Transactions on Electron Devices, Vol. ED-25, no. 10, October, 1978. Preferred anisotropic silicon etchants have a much slower etch rate on the (111) plane of the silicon relative to the (100) plane. As a result, by masking the (100) plane, uniformly shaped recesses can be etched into the silicon. The difference in geometry of recesses 22 and 24 is a result of the shape of the "island" area that is not masked and the etch time. The "island" area is smaller for recess 24, and thus the recess "bottomed out" in the V-shaped cross-section in the same amount of etch time that it took to form the flat-bottomed recess 22. (If etching had continued, recess 22 would eventually also have bottomed out in a V-shaped cross-section having a greater depth.) Thus, different geometries can be readily obtained by varying the etchant used, the mask pattern, and the etch time.

Other embodiments are within the claims.

What is claimed is:

1. A semiconductor substrate on one side of which a plurality of active devices will be formed, the semiconductor substrate comprising:

a first planar surface on which the active devices will be formed, a second planar surface on the opposite side of the substrate from the first planar surface, and a recess extending into the substrate from the second planar surface.

2. The semiconductor substrate of claim 1 comprising a plurality of recesses.

3. The semiconductor substrate of claim 2 wherein said recesses are arranged in an array.

4. The semiconductor substrate of claim 3 wherein said recesses are arranged in linear rows and columns.

5. The semiconductor substrate of claim 1 wherein said recess is substantially pyramidal or truncated pyramidal in shape.

6. The semiconductor substrate of claim 1 wherein said recess extends through about 20 to 85% of the thickness of the substrate.

7. The semiconductor substrate of claim 1 further comprising a layer of highly conductive material on the surface of the recess.

8. The semiconductor substrate of claim 1 wherein the angle of the recess wall with respect to the planar substrate surface is from about 40 to 90 degrees.

* * * * *